(12) United States Patent
Yu

(10) Patent No.: US 6,251,745 B1
(45) Date of Patent: Jun. 26, 2001

(54) TWO-DIMENSIONAL SCALING METHOD FOR DETERMINING THE OVERLAY ERROR AND OVERLAY PROCESS WINDOW FOR INTEGRATED CIRCUITS

(75) Inventor: Shinn-Sheng Yu, Taichung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/376,427

(22) Filed: Aug. 18, 1999

(51) Int. Cl.[7] .................................................. H01L 21/76
(52) U.S. Cl. ................................. 438/401; 438/462
(58) Field of Search ........................ 438/14, 401, 462, 438/975, 942, 943, 944, 945, 946

(56) References Cited

U.S. PATENT DOCUMENTS

| | | | |
|---|---|---|---|
| 5,365,072 | * 11/1994 | Turner et al. | 250/491 |
| 5,444,538 | 8/1995 | Pellegrini | 356/401 |
| 5,498,500 | * 3/1996 | Bae | 430/22 |
| 5,633,505 | * 5/1997 | Chung et al. | 250/491 |
| 5,731,113 | 3/1998 | Ueno | 430/22 |
| 5,982,044 | * 11/1999 | Lin et al. | 257/797 |
| 6,077,756 | * 6/2000 | Lin et al. | 438/401 |

* cited by examiner

Primary Examiner—David Nelms
Assistant Examiner—David Nhu
(74) Attorney, Agent, or Firm—George O. Saile; Stephen B. Ackerman

(57) ABSTRACT

A novel two-dimensional scaling method is used to determine overlay errors on a pilot wafer for more accurate alignment when a photoresist is exposed in a step-and-repeat tool on product wafers. The method is useful for accurately aligning interconnections over contact holes in field (circuit) areas. A first photoresist layer is deposited on a pilot wafer having a planar insulating layer, and exposed through a first reticle that is stepped across the wafer to form contact holes in the array of field areas and first registration patterns adjacent to the field areas. Contact holes are etched and filled with metal. A conducting layer is deposited. A second photoresist layer is deposited and exposed through a second reticle to form an etch mask for interconnections and second registration patterns. During exposure, the interfield expansion parameter in the algorithm for the step-and-repeat tool is used to gradually shift the image from wafer center to wafer edge in both x and y directions. This 2-D scaling allows the overlay error between the interconnections and contact holes to be more accurately measured in each field area. The overlay error data provides registration pattern parameters used in the algorithm to improve alignment in the individual field areas on product wafers.

18 Claims, 2 Drawing Sheets

TWO-DIMENSIONAL SCALING METHOD FOR DETERMINING THE OVERLAY ERROR AND OVERLAY PROCESS WINDOW FOR INTEGRATED CIRCUITS

BACKGROUND OF THE INVENTION

(1) Field of the Invention

The present invention relates to semiconductor processing for integrated circuits, and more particularly relates to a method for more accurately measuring overlay alignment errors to determine the process window. More specifically, the method allows one to implement interfield and intrafield overlay correction parameters during photoresist exposure in a step-and-repeat or step-and-scan exposure tool to more accurately align electrical interconnections over contact holes.

(2) Description of the Prior Art

Integrated circuits are formed in field areas on semiconductor substrates (wafers), such as single-crystal silicon (Si) substrates. After forming the discrete devices in and on the substrate, multilevels of electrically conducting layers and insulating layers are deposited and patterned to form the local and global interconnections for the integrated circuit. The patterned conducting layers, such as polycide and metal layers, are used to form the various levels of electrical interconnections. The interposing insulating layers, such as silicon oxide having contact holes or vias, are used to electrically insulate the various metal levels, while the contact holes or vias in the insulating layer provide connections between the various levels of conducting layers. As feature sizes decrease and circuit density increases, the accurate alignment of the various patterned layers becomes more critical for making reliable integrated circuits (ICs).

A patterned photoresist layer is usually used as an etching mask to pattern the conducting layers and to etch the contact holes in the insulating layers. In early technologies, after spin coating a photoresist layer on the wafer, the photoresist was exposed with radiation through a single mask to define an array of field (chip) areas on the wafer. Alignment marks formed on the wafer from a previous masking and etching step was used to align the next mask level for exposing the photoresist for patterning the underlying layer. However, as the wafer diameter increased from less than 25 millimeters (mm) in the late 1960s to the current 300 mm, and minimum feature sizes of the devices decreased to less than a micrometer, it became increasingly difficult to accurately align a patterned photoresist layer over an underlying patterned layer on the wafer within the required process window, using a single mask.

An alternative method currently in use is to expose the photoresist through a reticle using a step-and-repeat system (or step-and-scan system) that exposes the photoresist in fixed increments across the two-dimensional wafer surface to define an array of field (circuit) areas. The reticle, which contains the circuit pattern, is aligned to alignment marks in the kerf area adjacent to each field area on the wafer. One type of alignment pattern generally used is a rectangle or square, commonly referred to as box-in-box alignment. However as the circuit feature sizes decrease below a micrometer (um), it becomes increasingly difficult to ensure that the registration of one alignment mark on a reticle, when aligned to the alignment mark etched in the wafer from a previous reticle, results in an acceptable alignment of the circuit elements in the field (circuit) areas.

Several methods of improving registration between different levels during photoresist exposure using a step-and-repeat tool have been reported in the literature. For example, Pelegrini in U.S. Pat. No. 5,444,538 describes a method for measuring the registration error between two different step-and-repeat tools having a one-to-one and a two-to-one field area. Pelegrini's method allows one to mix and match steppers from different manufacturers. Another method of reducing the registration error during photoresist exposure with a step-and-repeat tool is described by Ueno, U.S. Pat. No. 5,731,113. Ueno's method calculates registration errors between first and second misalignment inspection marks and corrects the misalignment by taking one-half the sum of the maximum and minimum values to obtain a correction value.

In the current high-density technology, planar surfaces are desirable because of the shallow depth of focus (DOF) required to expose high-resolution photoresist images. Also, a planar surface is essential to anisotropically (directionally) plasma etch metal patterns without leaving residue that would otherwise remain in recesses in a non-planar underlying insulating layer and result in intralevel shorts. Unfortunately, when a blanket conducting layer (opaque layer) is deposited on the planar surface of a wafer, it is difficult to correlate the registration of the alignment marks with the actual alignment of the circuit elements in the field area when After Development Inspection (ADI) of the photoresist layer is performed, since the overlay is not visible in an optical microscope or a scanning electron microscope (SEM). Therefore, it is necessary to etch the conducting layer (opaque layer) and to perform an After Etch Inspection (AEI) to ensure the pattern is aligned within the process window. If the misalignment is too great, it is necessary to rework the product wafer by stripping th e conductive layer. This stripping may be difficult to achieve and is not cost effective. This misalignment is a problem on current product, such as DRAMs, SRAMs, and the like, where the overlay tolerance is only about 100 nanometers. ($1.0 \times 10^{-9}$ meters).

Since there may not be an accurate relation between the overlay of the alignment marks (box in box) in the kerf areas and the overlay of the circuit patterns in the field areas when design rules are tight, there is still a need in the semiconductor industry to provide a method for determining overlay error corrections for the alignment mark prior to exposing the photoresist on product wafers in a step-and-repeat tool.

SUMMARY OF THE INVENTION

It is therefore a principal object of this invention to provide a method for reducing intrafield and interfield overlay errors when exposing a photoresist layer on a semiconductor substrate through a reticle in a step-and-repeat or step-and-scan exposure tool.

It is another object of this invention to use a pilot wafer for generating a two-dimensional scaling plot having registration patterns and circuit patterns from which alignment error is measured prior to exposing the photoresist on product wafers. The alignment error is used to generate alignment correction factors for registration patterns that are then used in the algorithm for the step-and-repeat or step-and-scan exposure tool to expose the photoresist patterns with improved alignment on product wafers.

Still another objective of this invention is to fine tune the box-in-box overlay of the registration patterns utilizing these correction factors when the alignment tolerance is tight and requires a high degree of accuracy, more specifically, when aligning electrical interconnect patterns over contact holes.

These objectives are accomplished by providing a method using a pilot wafer which has a planar insulating layer on its surface. A first photoresist layer is deposited on the pilot wafer. The first photoresist layer is then exposed with radiation through a first reticle to pattern the first photoresist layer for etching contact holes in the insulating layer over the field areas. The first reticle is stepped across the pilot wafer using a step-and-repeat or step-and-scan tool to form an array of field areas for circuits, while concurrently forming first registration patterns (box-in-box) in kerf areas adjacent to the field areas. The first photoresist is then developed and is used as an etch mask for etching contact holes in the planar insulating layer and to etch first registration patterns in the insulating layer adjacent to each field. The first photoresist layer is removed and electrical conducting plugs, such as metal plugs, are then formed in the contact holes. The electrical interconnections are formed next. A blanket electrically conducting layer, such as a polycide layer or metal layer, is deposited on the pilot wafer. A second photoresist layer is deposited over the conducting layer to pattern the blanket conducting layer.

A second reticle is stepped across the pilot wafer using a step-and-repeat or step-and-scan tool and associated software (algorithm) to determine the original interfield and intrafield overlay correction parameters to align the alignment mark on the second reticle to the first alignment mark in the planar insulating layer. This corrects the original overlay errors.

Now, by the method of this invention, an additional overlay correction of interfield expansion to make translational overlay errors of each field gradually increase across the pilot wafer (for example, from wafer center to wafer edge) is implement. Concurrently, second registration patterns are formed over the first registration patterns in the kerf area. This gradual increase in translational overlay error is accomplished by adjusting the interfield expansion correction parameter in the algorithm for the step-and-repeat or step-and-scan tool. Utilizing this expansion correction parameter, the second photoresist layer is exposed with radiation through the second reticle across the pilot wafer to form electrical interconnections over the contact holes in each of the field areas. The second photoresist is then developed and used as an etch mask. An anisotropic plasma etch is carried out to pattern the conductive layer to form the interconnections over the contact holes. The second photoresist layer is then stripped. The field areas are then inspected to determine the misalignment in each field area. Because the expansion parameter for the step-and-repeat tool is gradually increased for the translational overlay errors of each field across wafer, the alignment errors between the contact holes and the interconnections are easy to see and measure. For example, the misalignment can be measured using an optical microscope. For submicron structures the measurements can also be made using an in-line scanning electron microscope (SEM). Still another method is to design and build electrical test circuits in the field areas on the pilot wafer and electrically probe the test circuits to measure the contact resistance and to determine the yield center and yield window.

The misalignment between the metal pattern and the via hole in the circuit pattern is then used to correct the shift between the registration patterns. This correction in shift is then used to correct the algorithm for the step-and-repeat tool when the second photoresist on the product wafers is exposed.

These measurements allow one to implement a translational overlay correction to shift the zero overlay error to an area on the wafer, more specifically to the center of wafer. The overlay error corrections measured on the circuit pattern and correlated to the registration pattern on the pilot wafer from the pilot run are then implemented in the software (algorithm) for the step-and-repeat tool to correct the alignment errors in the x and y directions at each of the field areas when the reticle is stepped across the product wafer. This allows the critical alignment of the photoresist pattern for etching the metal pattern (opaque layer) over via holes prior to etching the metal.

BRIEF DESCRIPTION OF THE DRAWINGS

The objects and other advantages of this invention are best understood with reference to the embodiment when read in conjunction with the following drawings.

DESCRIPTION OF THE PREFERRED EMBODIMENT

The preferred embodiment of this invention is now described in detail for using a two-dimensional scaling plot for efficiently and accurately determining the overlay error and overlay process window for exposing a photoresist layer on a pilot wafer using a step-and-repeat or step-and-scan exposure tool. The overlay errors are then used to determine correction parameters that are used as input to the software or algorithm in the step-and-repeat tool to provide a more accurate alignment for product wafers. This method is especially useful for determining the overlay on a planar surface with an opaque conducting layer, such as when patterning metal interconnections over contact holes or vias. The method is best described with reference to FIG. 1, in which the sequence of process steps is given, and to FIG. 2, which depicts the top view of a pilot wafer after the opaque conducting layer is patterned to form the electrical interconnections.

Although the method is particularly useful for etching interconnections over contact holes, it should be understood by those skilled in the art that the method is generally applicable for improving the alignment on semiconductor substrates having planar surfaces.

Figure 1:
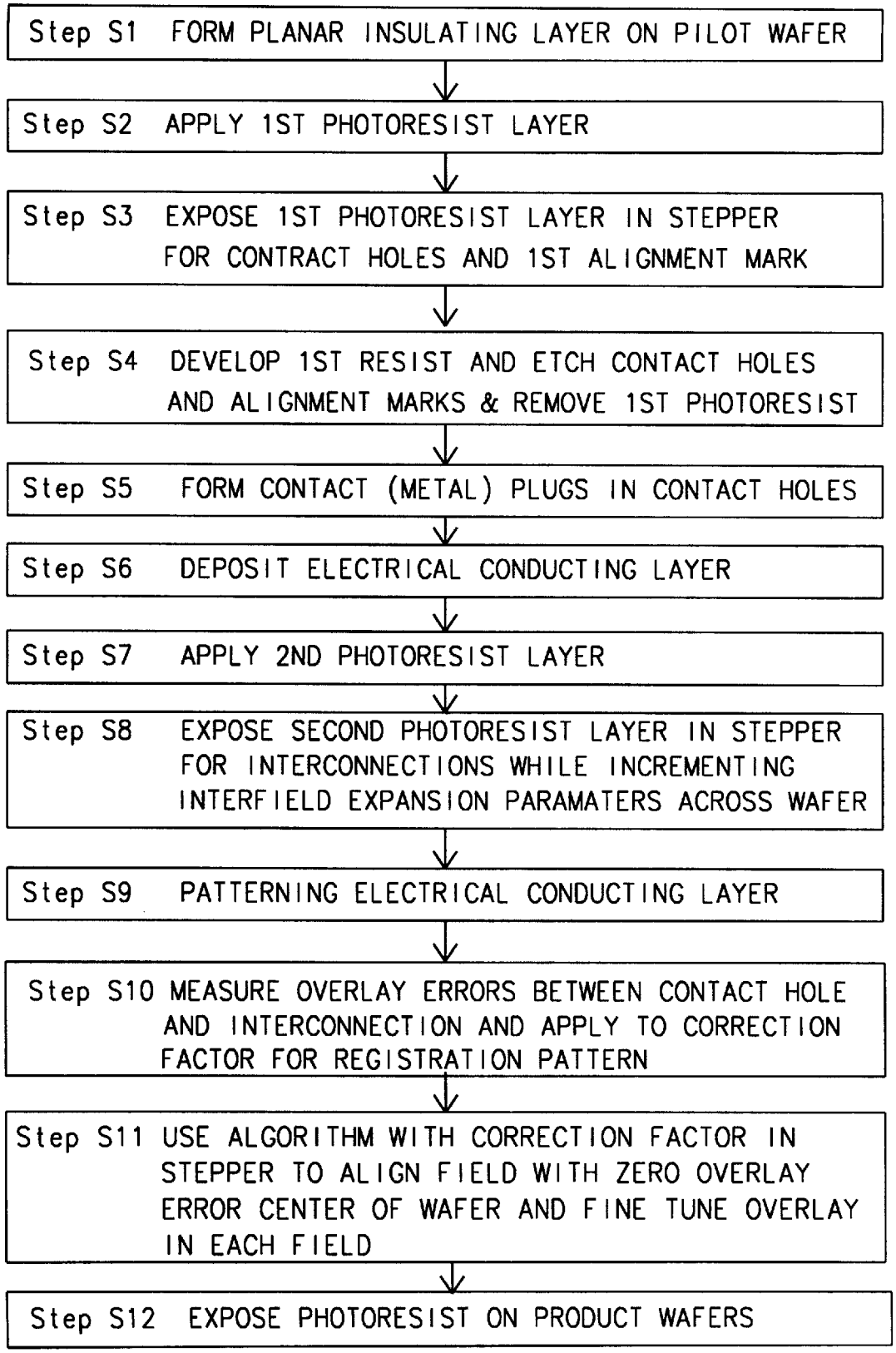
FIG. 1 is a flow chart showing the steps involved in carrying out the method of this invention for determining the overlay error and overlay process window.
Figure 2:
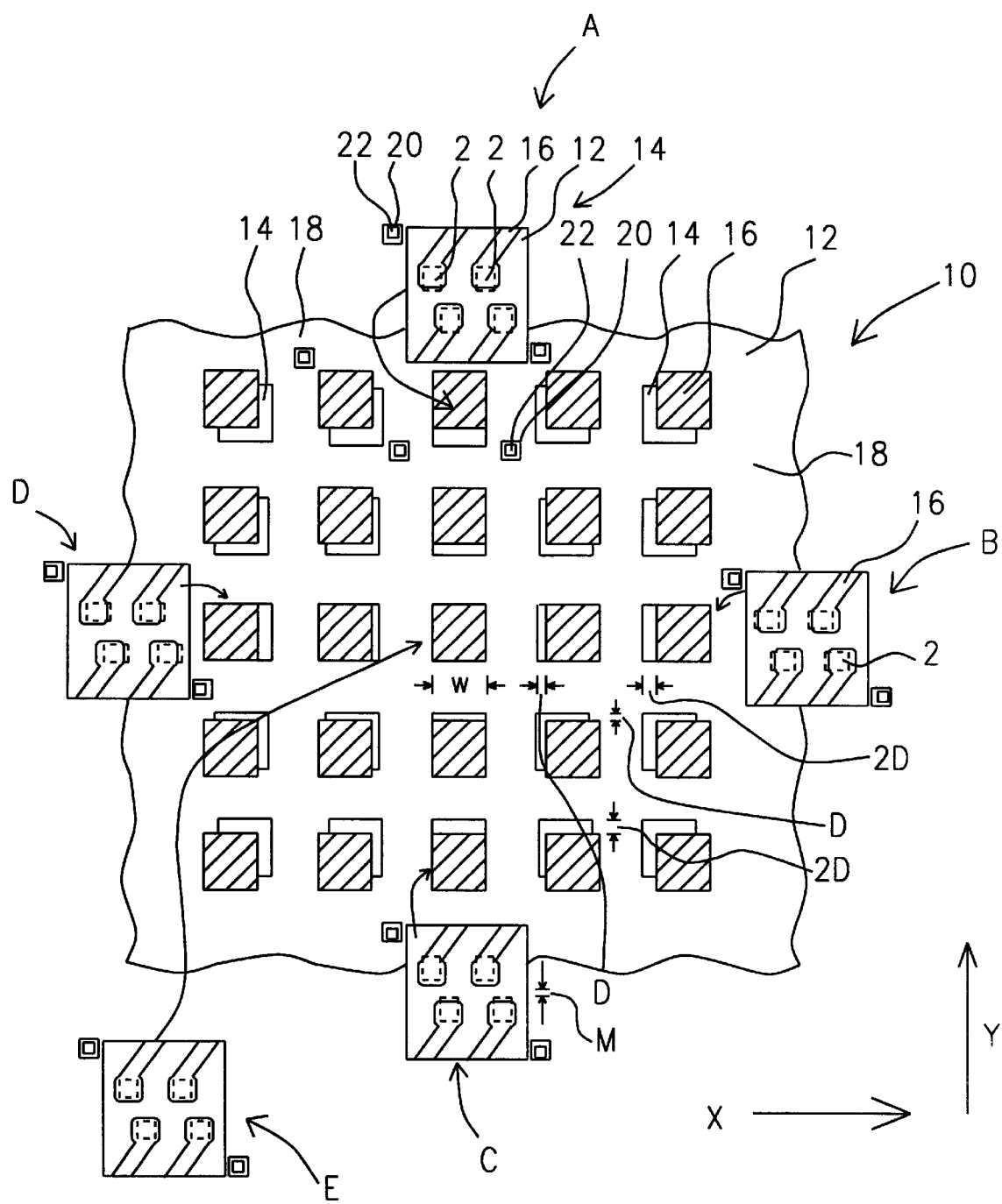
FIG. 2 shows a top view of a center portion of a wafer having a 5×5 array of field areas in which an interfield expansion is used during exposure of a second photoresist layer for forming interconnections over contact holes in an insulating layer, by the method of this invention. The inserts in FIG. 2 are enlarged view of the field areas showing in more detail portions of the interconnections over contact holes after the electrical conducting layer is patterned.

Referring now to FIG. 1, Step S1, the method involves providing a pilot wafer 10, a portion of which is shown in the top view of FIG. 2. Typically the wafer is a blank silicon substrate such as are used for product wafers. A planar insulating layer 12 is deposited on the pilot wafer 10. Preferably the insulating layer 12 is a chemical-vapor-deposited (CVD) silicon oxide and is deposited to a thickness that is typically used on product wafers. The thickness is typically between about 3000 and 8000 Angstroms. Next, as stated in Step S2, a first photoresist layer (not shown) is deposited on the pilot wafer, and as stated in Step S3, the first photoresist layer is then exposed with radiation through a first reticle. The first reticle is stepped across the pilot wafer using a step-and-repeat tool, and the first photoresist is exposed to form contact holes for circuits in an array of field areas 14, while concurrently forming first registration patterns 20 (box in box) in kerf areas 18 adjacent to the field areas 14. To simplify the drawing in FIG. 2, a top view of only a portion of the array (5×5 array) of field areas is shown for the center portion of the pilot wafer. To better visualize the structure, inserts A, B, C, D, and E of FIG. 2 show enlarged views of a portion of a field area on the wafer. The inserts A, B, C, D, and E in FIG. 2 show only a portion of a field area depicting a few inter-connections over contact holes after patterning a conducting layer. Normally on a product wafer the number of contact holes can typically far exceed one million, but only a few are depicted here to simplify the drawings.

Referring to Step S4 of FIG. 1, and as shown in the inserts A, B C, D, and E of FIG. 2, the patterned first photoresist layer (not shown) is then developed and is used as an etch mask for etching contact holes 2 in the planar insulating layer 12. First registration patterns 20 are also concurrently etched in the insulating layer 12 (in kerf areas 18) adjacent to each field area 14. The etching is typically carried out using the same etch process that is used for the product wafers. For example, the etching is an anisotropic etching using a reactive ion etcher or a high-density plasma etcher and an etchant gas such as carbon tetrafluoride ($CF_4$) or trifluoromethane ($CHF_3$).

Referring to Step S5, after stripping the first photoresist layer, electrically conducting plugs, such as metal plugs, are then formed in the contact holes 2. For example. the metal plugs can be formed by depositing a tungsten layer and chemically-mechanically polishing back to the insulating layer 12.

Referring to Step S6 in FIG. 1, the electrical interconnections are formed next. A blanket electrically conducting layer 16 is deposited on the pilot wafer. The conducting layer can be a polycide layer or a metal layer such as aluminum or copper. And as stated in Step S7, a second photoresist layer (not shown) is spin coated over the blanket conducting layer and will be patterned to form an etch mask for etching the interconnections from the blanket conducting layer. Typically the conducting layer 16 is deposited to a thickness used on product wafers, and generally to a thickness of between about 3000 and 8000 Angstroms.

Referring to Step S8 in FIG. 1, a second reticle is stepped across the pilot wafer using a step-and-repeat tool and associated software (algorithm) to determine the original interfield and intrafield overlay correction parameters. This is achieved by aligning the alignment mark (not shown) on the second reticle to the first alignment mark (also not shown) that was previously etched in the planar insulating layer. Concurrently, second registration patterns (box 22) are etched in the conducting layer 16 over and in the first registration patterns 20 for each field, as depicted by the box-in-box overlay (box 22 in box 20) for Insert A in FIG. 2.

After correcting the original overlay errors, and as specified in Step S8 of FIG. 1, this invention utilizes an additional interfield expansion correction parameter to gradually shift the overlay of the patterned conducting layer 16 over the contact holes 2 in each field area, for example, from wafer center to wafer edge, as shown in FIG. 2. This intentional shift in the patterned layer 16 is carried out in both the x and y directions, as depicted by the shift D in FIG. 2.

In general, the shift in the overlay in each field can be expressed by $$D = W \times C$$

where:

W is the Field Size in millimeters (mm)

C is Expansion Factor expressed as a fraction of W (e.g., in parts per million (ppm))

D is Overlay Shift

By way of example only, if the field area 14 has a width W of 20 mm, and if the interfield expansion factor C is 1 ppm, then the shift D is 20 nanometers (nm).

The shift D is accomplished by adjusting the interfield expansion correction parameter in the algorithm for the step-and-repeat tool. Utilizing this expansion correction parameter, the second photoresist layer is exposed with radiation through the second reticle, which is stepped across the pilot wafer. The second photoresist layer is then developed and used as an etch mask to etch the interconnections 16, as specified in Step S9 of FIG. 1 and as shown in the inserts A, B, C, D, and E of FIG. 2. For example, the metal etching can be performed in a RIE etcher using an etchant gas containing chlorine and/or bromine.

Referring to Step S10, the field areas 14 are then inspected by using an after-etch inspection (AEI) to determine the misalignment M of the interconnections 16 over the contact holes 2 in each field area, as depicted in Insert C of FIG. 2. Because the expansion parameter for the step-and-repeat tool is gradually increased for the translational overlay errors of each field across the wafer, the alignment error M between the contact holes 2 and the interconnections 16 are easy to see and measure. Typically in current product the contact holes 2 can have a diameter of 0.2 micrometers (um) and overlying interconnecting lines 16 can have a width of about 0.32 to 0.44 um. The misalignment between the contact hole 2 and the interconnecting line 16 can be measured, for example, using an optical microscope. However, for submicron dimensions which are not easily measured using an optical microscope, the measurements can be carried out using an in-line scanning electron microscope (SEM). Still another method is to design and build electrical test circuits in the field areas 14 on the pilot wafer and electrically probe the test circuits to measure the contact resistance and to determine the yield center and yield window. As shown in Insert C of FIG. 2, the overlay error M between the patterned metal 16 and the via hole 2 in the circuit pattern area is then used to provide corrections for the alignment of the registration patterns (box 22 and box 20). Also, this allows one to determine the field that has zero overlay error (accurately aligned) in the array of fields.

Referring to Step S11 of FIG. 1, the corrections for the registration patterns can be used to implement a translational overlay correction in the algorithm to shift the fields such that the field that has zero overlay error is shifted to any desired area on the wafer. More specifically, if the field with zero overlay error is not at the center of the wafer, the translational overlay correction parameters can be modified in the algorithm to shift the fields so that the field with zero overlay error is at the center of wafer.

Referring to Step S12 of FIG. 1, the overlay error corrections as determined from the registration patterns on the pilot wafer are then implemented in the software (algorithm) for the step-and-repeat or step-and-scan tool to correct the alignment errors in the x and y directions at each of the field areas when the reticle is stepped across a product wafer.

While the invention has been particularly shown and described with reference to the preferred embodiment thereof, it will be understood by those skilled in the art that various changes in form and detail may be made without departing from the spirit and scope of the invention.

What is claimed is:

1. A method for improving alignment in a step-and-repeat tool comprising the steps of:

providing a pilot wafer having a planar insulating layer thereon;

depositing a first photoresist layer on said pilot wafer and exposing said first photoresist layer with radiation through a first reticle that is stepped across said pilot wafer for forming contact holes in field areas while concurrently forming first registration patterns in periphery of said field areas;

developing said first photoresist layer to form an etch mask for forming said contact holes;

etching said contact holes and said first registration patterns in said planar insulating layer and removing said first photoresist layer;

forming conducting plugs in said contact holes;

depositing a conducting layer on said pilot wafer;

depositing a second photoresist layer on said pilot wafer;

exposing with radiation said second photoresist layer through a second reticle that is stepped across said pilot wafer for forming interconnections over said contact holes in said field areas while forming second registration patterns over said first registration patterns in said planar insulating layer, and concurrently adjusting interfield expansion parameters to gradually increase the translational overlay errors of each field from center to edge of said pilot wafer;

developing said second photoresist layer to form an etch mask for forming said interconnections;

patterning said conducting layer to form said interconnections in said field areas and said second registration patterns over said first registration patterns, and removing said second photoresist layer;

measuring overlay errors between said contact holes and said interconnections in said field areas to determine the overlay correction parameters for said registration patterns;

using interfield translation parameters to shift the field with zero overlay error to center of said pilot wafer;

using said overlay correction parameters for said registration patterns in said algorithm for said step-and-repeat tool to develop photoresist patterns with improved alignment accuracy on product wafers.

2. The method of claim 1, wherein said pilot wafer is a semiconductor substrate.

3. The method of claim 1, wherein said planar insulating layer is silicon oxide.

4. The method of claim 1, wherein said contact holes in said field areas are for connecting levels of electrical interconnections for integrated circuits.

5. The method of claim 1, wherein said conducting layer is a material selected from the group that includes polysilicon, refractory metal polycide, and metal.

6. The method of claim 1, wherein said first and said second alignment marks are square-shaped box-in-box marks.

7. The method of claim 1, wherein said overlay errors are measured using an optical microscope.

8. The method of claim 1, wherein said overlay errors are measured using a scanning electron microscope.

9. The method of claim 1, wherein said overlay errors are measured using electrical interconnections.

10. A method for improving alignment in a step-and-repeat tool comprising the steps of:

providing a pilot wafer having a planar insulating layer thereon;

depositing a first photoresist layer on said pilot wafer and exposing said first photoresist layer with radiation through a first reticle that is stepped across said pilot wafer for forming contact holes in field areas while concurrently forming first registration patterns in periphery of said field areas;

developing said first photoresist layer to form an etch mask for forming said contact holes;

etching said contact holes and said first registration patterns in said planar insulating layer and removing said first photoresist layer;

forming conducting plugs in said contact holes;

depositing a metal layer on said pilot wafer;

depositing a second photoresist layer on said pilot wafer;

exposing with radiation said second photoresist layer through a second reticle that is stepped across said pilot wafer for forming interconnections over said contact holes in said field areas while forming second registration patterns over said first registration patterns in said planar insulating layer, and concurrently adjusting interfield expansion parameters to gradually increase the translational overlay errors of each field from center to edge of said pilot wafer;

developing said second photoresist layer to form an etch mask for forming said interconnections;

patterning said metal layer to form said interconnections in said field areas and said second registration patterns over said first registration patterns, and removing said second photoresist layer;

measuring overlay errors between said contact holes and said interconnections in said field areas to determine the overlay correction parameters for said registration patterns;

using interfield translation parameters to shift the field with zero overlay error to center of said pilot wafer;

using said overlay correction parameters for said registration patterns in said algorithm for said step-and-repeat tool to develop photoresist patterns with improved alignment accuracy on product wafers.

11. The method of claim 10, wherein said pilot wafer is a semiconductor substrate.

12. The method of claim 10, wherein said planar insulating layer is silicon oxide.

13. The method of claim 10, wherein said contact holes in said field areas are for connecting levels of electrical interconnections for integrated circuits.

14. The method of claim 10, wherein said metal layer is an aluminum-copper alloy.

15. The method of claim 10, wherein said first and said second registration patterns are square-shaped box-in-box marks.

16. The method of claim 10, wherein said overlay errors are measured using an optical microscope.

17. The method of claim 10, wherein said overlay errors are measured using a scanning electron microscope.

18. The method of claim 10, wherein said overlay errors are measured using electrical interconnections.

* * * * *